(12) United States Patent
Yamasuge

(10) Patent No.: US 10,038,124 B2
(45) Date of Patent: Jul. 31, 2018

(54) LIGHT-EMITTING DEVICE AND METHOD FOR PRODUCING LIGHT-EMITTING DEVICE

(71) Applicant: Dexerials Corporation, Shinagawa-ku, Tokyo (JP)

(72) Inventor: Takehiro Yamasuge, Utsunomiya (JP)

(73) Assignee: Dexerials Corporation, Shinagawa-ku, Tokyo (JP)

( * ) Notice: Subject to any disclaimer, the term of this patent is extended or adjusted under 35 U.S.C. 154(b) by 0 days.

(21) Appl. No.: 15/244,644

(22) Filed: Aug. 23, 2016

(65) Prior Publication Data

US 2017/0062669 A1 Mar. 2, 2017

(30) Foreign Application Priority Data

Aug. 25, 2015 (JP) ................. 2015-166108

(51) Int. Cl.
| | |
|---|---|
| H01L 33/50 | (2010.01) |
| H01L 33/54 | (2010.01) |
| H01L 33/60 | (2010.01) |
| B29C 39/10 | (2006.01) |
| B29C 39/26 | (2006.01) |
| B29K 83/00 | (2006.01) |

(52) U.S. Cl.
CPC ............ *H01L 33/507* (2013.01); *B29C 39/10* (2013.01); *B29C 39/26* (2013.01); *H01L 33/54* (2013.01); *B29K 2083/00* (2013.01); *B29K 2827/18* (2013.01); *H01L 33/60* (2013.01); *H01L 2933/005* (2013.01); *H01L 2933/0041* (2013.01)

(58) Field of Classification Search
None
See application file for complete search history.

(56) References Cited

U.S. PATENT DOCUMENTS

| 8,907,361 B2* | 12/2014 | Kim | ...................... H01L 33/54 |
| | | | 257/100 |
| 2009/0115313 A1* | 5/2009 | Lu | ........................ H01L 33/505 |
| | | | 313/503 |
| 2013/0087822 A1* | 4/2013 | Kim | ........................ H01L 33/54 |
| | | | 257/98 |

(Continued)

FOREIGN PATENT DOCUMENTS

| JP | 2005235847 A | 9/2005 |
| JP | 2012138422 A | 7/2012 |

*Primary Examiner* — Hoang-Quan Ho
(74) *Attorney, Agent, or Firm* — Kenja IP Law PC

(57) ABSTRACT

Provided is a light-emitting device that has excellent light extraction efficiency, inhibits deterioration of light-emission characteristics over time, and can be easily produced. The light-emitting device includes a substrate, a solid-state light-emitting element mounted on the substrate, a circular tube-shaped member positioned on the substrate such as to surround the solid-state light-emitting element, and a transparent resin portion including a cylindrical section that encapsulates the solid-state light-emitting element and that is in contact with an inner surface of the circular tube-shaped member, and a dome-shaped section that is positioned above the cylindrical section. The inner surface of the circular tube-shaped member is water repellent. The dome-shaped section contains a phosphor that is excited by light of a light-emission wavelength of the solid-state light-emitting element.

4 Claims, 6 Drawing Sheets

(56) References Cited

U.S. PATENT DOCUMENTS

2013/0140580 A1* 6/2013 Wirth .................. H01L 25/0753
                                                    257/76
2015/0166888 A1* 6/2015 Katsumoto ........ C09K 11/7774
                                                  252/301.4 R

* cited by examiner

LIGHT-EMITTING DEVICE AND METHOD FOR PRODUCING LIGHT-EMITTING DEVICE

TECHNICAL FIELD

The present disclosure relates to a light-emitting device and a method for producing a light-emitting device.

BACKGROUND

Light-emitting devices that use solid-state light-emitting elements such as light-emitting diodes (LEDs) are currently in practical use. A light-emitting device that uses a solid-state light-emitting element typically has a structure in which the solid-state light-emitting element is sealed and protected by a transparent resin and in which a phosphor for wavelength conversion is dispersed in the transparent resin as appropriate.

In recent years there has been demand for light-emitting devices such as described above to exhibit, for example, high output, various tones, and a wide color gamut. Furthermore, in accompaniment to the maturing of techniques pertaining to white LEDs, there is demand for these light-emitting devices to be compatible with a wide range of phosphors.

In one example of a conventional technique pertaining to a light-emitting device that uses a solid-state light-emitting element, PTL 1 discloses a bath tub-type LED package. Specifically, as illustrated in FIG. 5, the LED package disclosed in PTL 1 includes a bath tub portion 110 filled with a sealing resin 105 containing a phosphor 106 and having an inner surface that is inclined such as to ensure a light-emission path for an LED 103.

In another example of a conventional technique pertaining to a light-emitting device that uses a solid-state light-emitting element, PTL 2 discloses a bath tub-type LED package that includes a silicone lens. Specifically, as illustrated in FIG. 6, the LED package disclosed in PTL 2 includes a silicone lens 208 that is affixed to the surface of a sealing resin 205 such that the amount of light that is extracted in an upward direction from the LED package is increased.

CITATION LIST

Patent Literature

PTL 1: JP 2005-235847 A
PTL 2: JP 2012-138422 A

SUMMARY

However, in the LED package disclosed in PTL 1, the outer surface of the sealing resin has a flat shape, and some light is reflected off a flat internal surface of the sealing resin and becomes trapped in the LED package. Consequently, the LED package disclosed in PTL 1 suffers from a problem of insufficient light extraction efficiency.

Furthermore, the LED package disclosed in PTL 2 is obtained by separately forming the silicone lens by cast molding or the like and then affixing the silicone lens to the sealing resin. Consequently, the LED package disclosed in PTL 2 suffers from a problem in terms of convenience of production because it is not possible to integrally produce the LED package. Furthermore, in the LED packages disclosed in PTL 1 and 2, most of a phosphor is unavoidably positioned in proximity to the LED, which reaches a high temperature during light emission. Consequently, the LED packages disclosed in PTL 1 and 2 suffer from a problem of deterioration of light-emission characteristics over time due to degradation of the aforementioned phosphor. Therefore, in the case of conventional LED packages such as described above, it has been necessary to limit the use of phosphors to only those that have relatively good light resistance and heat resistance in order to extend LED package life to a certain extent and, as a result, it has not been possible to satisfy recent demands.

The present disclosure is directed toward solving the various conventional problems described above and achieving the following objectives. Specifically, one objective of the present disclosure is to provide a light-emitting device that has excellent light extraction efficiency, inhibits deterioration of light-emission characteristics over time, and can be easily produced. Another objective of the present disclosure is to provide a light-emitting device production method that enables simple production of a light-emitting device that has excellent light extraction efficiency and inhibits deterioration of light-emission characteristics over time.

The present inventor conducted diligent investigation in order to achieve the objectives described above and, as a result of this investigation, discovered that a light-emitting device that has high light extraction efficiency and that sufficiently inhibits deterioration of light-emission characteristics over time can be easily obtained by at least using, as one element of the light-emitting device, a circular-tube shaped member having a water repellent inner surface. This discovery led to the present disclosure.

The present disclosure is based on the inventor's findings mentioned above and provides the following as a solution to the problems described above. Specifically, the present disclosure provides:

<1> A light-emitting device comprising:
a substrate;
a solid-state light-emitting element mounted on the substrate;
a circular tube-shaped member positioned on the substrate such as to surround the solid-state light-emitting element; and
a transparent resin portion including a cylindrical section that encloses the solid-state light-emitting element and that is in contact with an inner surface of the circular tube-shaped member, and a dome-shaped section that is positioned above the cylindrical section, wherein
the circular tube-shaped member has a water-repellent inner surface, and
the dome-shaped section contains a phosphor that is excited by light of a light-emission wavelength of the solid-state light-emitting element.

In the light-emitting device described in <1>, excellent light extraction efficiency can be obtained because the transparent resin portion includes the dome-shaped section positioned above the cylindrical section and can therefore form a convex lens mechanism. Moreover, in the light-emitting device described in <1>, as a result of at least a certain amount of the phosphor being contained in the dome-shaped section, deterioration of light-emission characteristics over time can be inhibited because degradation of the phosphor is less likely to occur. Furthermore, the light-emitting device described in <1> can be easily produced through use of the circular tube-shaped member having the water repellent inner surface.

<2> The light-emitting device described in <1>, wherein among the phosphor contained in the transparent resin portion, a portion of the phosphor that is closest to the substrate is at a position at least 500 μm higher than an upper edge of the solid-state light-emitting element.

<3> The light-emitting device described in <1> or <2>, wherein among the phosphor contained in the transparent resin portion, the portion of the phosphor that is closest to the substrate is at a position 100 μm lower than an upper edge of the circular tube-shaped member or at a position higher than the position.

<4> The light-emitting device described in any one of <1> to <3>, wherein the solid-state light-emitting element is a light-emitting diode.

<5> The light-emitting device described in <4>, wherein the light-emitting diode is a blue light-emitting diode and white light is obtained artificially through a combination of light emission by the blue light-emitting diode and light emission by the phosphor.

<6> A method for producing a light-emitting device, comprising:

positioning a circular tube-shaped member having a water repellent inner surface on a substrate on which a solid-state light-emitting element is mounted such that the circular tube-shaped member surrounds the solid-state light-emitting element;

potting a curable transparent resin composition containing a phosphor excited by light of a light-emission wavelength of the solid-state light-emitting element inside the circular tube-shaped member on the substrate to form an uncured transparent resin portion including a cylindrical section and a dome-shaped section; and curing the uncured transparent resin portion.

<7> A method for producing a light-emitting device, comprising:

positioning a circular tube-shaped member having a water repellent inner surface on a substrate on which a solid-state light-emitting element is mounted such that the circular tube-shaped member surrounds the solid-state light-emitting element;

potting a first curable transparent resin composition inside the circular tube-shaped member on the substrate to form an uncured first transparent resin portion having a cylindrical shape;

curing the uncured first transparent resin portion;

potting a second curable transparent resin composition containing a phosphor excited by light of a light-emission wavelength of the solid-state light-emitting element above the cured first transparent resin portion to form an uncured second transparent resin portion including a dome-shaped section; and curing the uncured second transparent resin portion.

<8> A method for producing a light-emitting device, comprising:

positioning a circular tube-shaped member having a water repellent inner surface on a substrate on which a solid-state light-emitting element is mounted such that the circular tube-shaped member surrounds the solid-state light-emitting element;

potting a first curable transparent resin composition inside the circular tube-shaped member on the substrate;

potting a second curable transparent resin composition containing a phosphor excited by light of a light-emission wavelength of the solid-state light-emitting element above the potted first curable transparent resin composition to form an uncured transparent resin portion including a cylindrical section and a dome-shaped section; and curing the uncured transparent resin portion.

According to the present disclosure, it is possible to solve the various conventional problems described above by providing a light-emitting device that has excellent light extraction efficiency, inhibits deterioration of light-emission characteristics over time, and can be easily produced. Furthermore, according to the present disclosure, it is possible to solve the various conventional problems described above by providing a light-emitting device production method that enables simple production of a light-emitting device that has excellent light extraction efficiency and inhibits deterioration of light-emission characteristics over time.

DETAILED DESCRIPTION (Light-Emitting Device)

Figure 1:
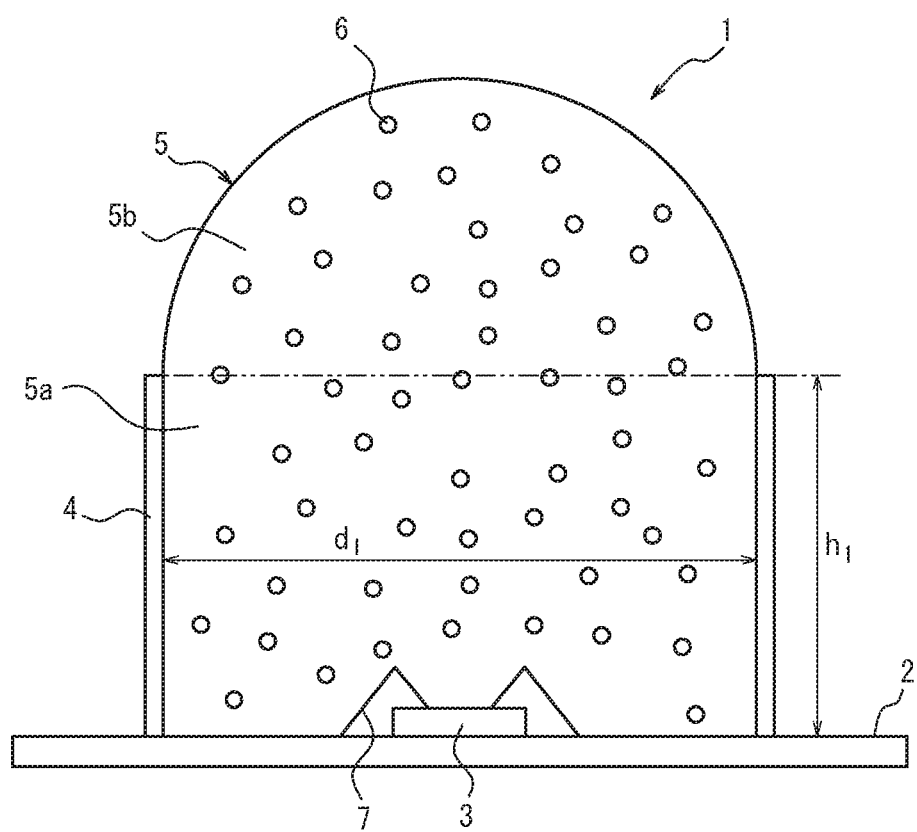
FIG. 1 is a schematic view of a light-emitting device according to an embodiment of the present disclosure.

The following uses FIG. 1 and so forth to describe a light-emitting device 1 according to one embodiment of the present disclosure.

The light-emitting device 1 according to one embodiment of the present disclosure (hereinafter, also referred to simply as a "presently disclosed light-emitting device") at least includes a substrate 2, a solid-state light-emitting element 3, a circular tube-shaped member 4, and a transparent resin portion 5. The transparent resin portion 5 contains a phosphor 6 that is excited by light of a light-emission wavelength of the solid-state light-emitting element 3. The presently disclosed light-emitting device 1 may further include other optional elements as required.

<Substrate>

The substrate 2 can be selected as appropriate depending on the objective without any specific limitations other than having a flat plate shape. The substrate 2 can be a substrate that is known in the technical field of light-emitting devices such as a ceramic substrate, a resin substrate, a metal substrate, or a glass epoxy substrate.

<Solid-State Light-Emitting Element>

The solid-state light-emitting element 3 is mounted on the substrate. Although the solid-state light-emitting element 3 illustrated in FIG. 1 is directly mounted on the substrate 2 in chip-on-board (COB) format, the mounting format is not limited to this format. The solid-state light-emitting element 3 includes electrodes that are connected to conductors on the substrate 2 via gold wires 7 by a method referred to as "wire bonding". However, the material of the wires and the connection format of the solid-state light-emitting element 3 and the substrate 2 are not limited to the examples given above.

The solid-state light-emitting element 3 can be selected as appropriate depending on the objective without any specific limitations and is for example a light-emitting diode. In a situation in which a light-emitting diode is used as the solid-state light-emitting element 3, the light-emitting diode can for example, without any specific limitations, be a blue light-emitting diode. Herein, the blue light-emitting diode is a light-emitting diode that has gallium nitride (GaN) as a main material and that emits light of a blue color. When the blue light-emitting diode is used as the solid-state light-emitting element 3, appropriate selection of the type of the phosphor 6 contained in the transparent resin portion 5 can enable white light to be obtained artificially through a combination of light emission by the blue light-emitting diode and light emission by the phosphor. A light-emitting device that uses a combination such as described above is advantageous in terms of production costs and life compared to a phosphor-free light-emitting device in which white light is obtained using RGB light-emitting diodes.

<Circular Tube-Shaped Member>

The circular tube-shaped member 4 is positioned on the substrate 2 such as to surround the solid-state light-emitting element 3. From a viewpoint of providing the light-emitting device 1 with uniform light-emission characteristics, the circular tube-shaped member 4 is preferably positioned on the substrate 2 such that the solid-state light-emitting element 3 is positioned at the center of a circle of the circular tube-shaped member 4. The circular tube-shaped member 4 may, without any specific limitations, be affixed to the substrate 2 using a freely selected adhesive.

The circular tube-shaped member 4 normally has a tube length ($h_1$ in FIG. 1) of at least 1.0 mm. From a viewpoint of separating as much as possible of the phosphor 6 present in the transparent resin portion 5 described further below from the solid-state light-emitting element 3 in order to sufficiently inhibit degradation of the phosphor 6 and deterioration of light-emission characteristics over time, the tube length of the circular tube-shaped member 4 is preferably at least 1.5 mm, and more preferably at least 2.0 mm. Moreover, from a viewpoint of sufficiently inhibiting attenuation of emitted light due to light reflection within the transparent resin portion, the tube length of the circular tube-shaped member 4 is preferably no greater than 5.0 mm, and more preferably no greater than 3.0 mm.

Although the internal diameter ($d_1$ in FIG. 1) of the circular tube-shaped member 4 can be selected as appropriate depending on the objective without any specific limitations, the internal diameter is preferably at least 3.0 mm, and more preferably at least 5.0 mm, from a viewpoint of the not adversely affecting production in relation to the solid-state light-emitting element such as wire bonding, and is preferably no greater than 10.0 mm, and more preferably no greater than 5.0 mm, from a viewpoint of enabling sufficient color mixing of light from the solid-state light-emitting element and light from the phosphor in order to prevent deviation in the chromaticity of emitted light.

The circular tube-shaped member 4 is required to have a water repellent inner surface. The reason for this is that as a result of the circular tube-shaped member 4 having a water repellent inner surface, a dome-shaped section 5b described further below can be easily formed. The entirety of the circular tube-shaped member 4 may be water repellent or only the inner surface of the circular tube-shaped member 4 may be water repellent. More specifically, the circular tube-shaped member 4 may be obtained by preparing a circular-tube shaped element using a non-water repellent material and subsequently coating an inner surface thereof with a water repellent material, or may be prepared using a water repellent material.

The water repellent material can be selected as appropriate depending on the objective without any specific limitations and can for example be a fluorine-containing resin or a silicone resin. In the present specification, the term "fluorine-containing resin" refers to a resin that contains fluorine atoms in molecules thereof and the term "silicone resin" refers to a resin having a main backbone formed by siloxane bonds. Examples of fluorine-containing resins that can be used include polytetrafluoroethylene (PTFE), polychlorotrifluoroethylene (PCTFE), polyvinylidene fluoride (PVDF), polyvinyl fluoride (PVF), perfluoroalkoxy fluoro resin (PFA), tetrafluoroethylene-hexafluoropropylene copolymer (FEP), ethylene-tetrafluoroethylene copolymer (ETFE), and ethylene-chlorotrifluoroethylene copolymer (ECTFE).

<Transparent Resin Portion>

The transparent resin portion 5 is made mainly from a transparent resin. The transparent resin portion 5 includes a cylindrical section 5a and a dome-shaped section 5b. As illustrated in FIG. 1, the cylindrical section 5a of the transparent resin portion 5 corresponds to a section that extends from the height of the substrate to the height of an upper edge of the circular tube-shaped member 4. In other words, the cylindrical section 5a is a section that is in contact with the inner surface of the circular tube-shaped member 4. The dome-shaped section 5b corresponds to a section that is positioned above the cylindrical section 5a and that has a dome shape. In other words, the dome-shaped section 5b is a section that is not in contact with the inner surface of the circular tube-shaped member 4. It should be noted that although the cylindrical section 5a and the dome-shaped section 5b of the light-emitting device 1 are distinguished between in order to facilitate explanation, the cylindrical section 5a and the dome-shaped section 5b may be formed integrally. In the transparent resin portion 5, the cylindrical section 5a encapsulates the solid-state light-emitting element 3. As a result of the presently disclosed light-emitting device 1 including the transparent resin portion that encapsulates the solid-state light-emitting element 3 and includes the dome-shaped section 5b as described above, the dome-shaped section 5b can form a convex lens mechanism and sufficiently high extraction efficiency of light originating from the solid-state light-emitting element 3 can be achieved.

The constituent transparent resin of the transparent resin portion 5 can be selected as appropriate depending on the objective without any specific limitations other than being a resin that is transparent and can for example be a curable transparent resin. Examples of curable transparent resins that can be used include thermosetting transparent resins such as phenyl silicone resins, methyl silicone resins, epoxy resins, and acrylic resins. Any one of such curable transparent resins may be used individually or any two or more of such curable transparent resins may be used in combination.

<Phosphor>

As illustrated in FIG. 1, the cylindrical section 5a and the dome-shaped section 5b of the transparent resin portion 5 contain a phosphor 6. However, in the present disclosure, it is only necessary for the dome-shaped section 5b to contain the phosphor 6. The phosphor 6 contained in the dome-shaped section 5b is unlikely to degrade because the phosphor 6 is separated from the solid-state light-emitting device 3 by at least the tube length of the circular tube-shaped member 4. In other words, the presently disclosed light-emitting device 1 inhibits deterioration of light-emission characteristics over time because at least a certain amount of the phosphor is unlikely to degrade.

Figure 2:
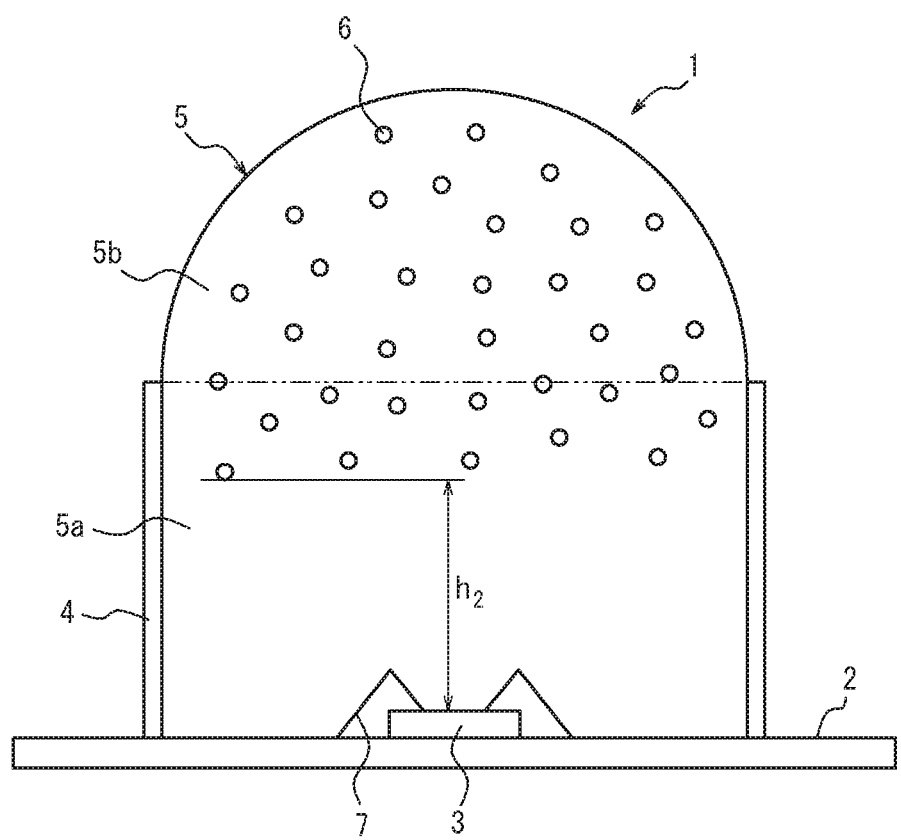
FIG. 2 is a schematic view of a light-emitting device according to another embodiment of the present disclosure.
Figure 3:
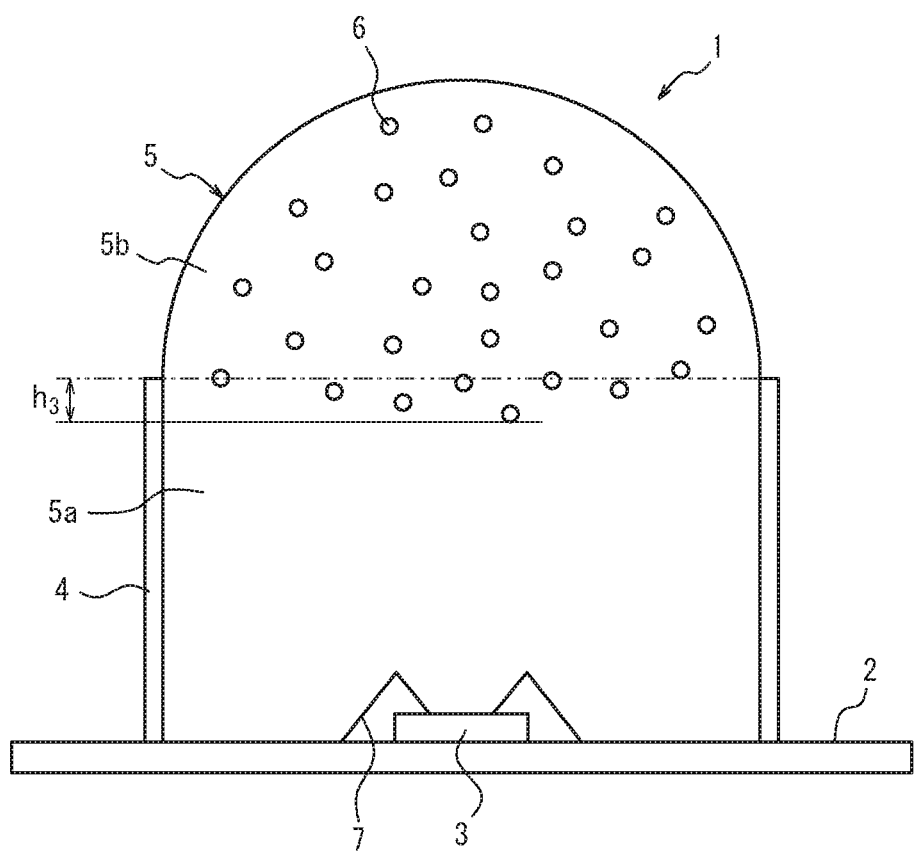
FIG. 3 is a schematic view of a light-emitting device according to yet another embodiment of the present disclosure.

Although the light-emitting device 1 illustrated in FIG. 1 has a configuration in which the phosphor 6 is dispersed roughly uniformly in both the cylindrical section 5a and the dome-shaped section 5b of the transparent resin portion 5 as described above, a configuration in which the phosphor 6 is not present in the cylindrical section 5a within a certain height from the solid-state light-emitting element 3 is preferable. More specifically, as illustrated in FIG. 2, among the phosphor 6 in the transparent resin portion 5, a portion of the phosphor 6 that is closest to the substrate 2 is preferably at a position at least 500 μm (corresponding to $h_2$ in FIG. 2) higher than an upper edge of the solid-state light-emitting element 3. Furthermore, as illustrated in FIG. 3, among the phosphor 6 in the transparent resin portion 5, the portion of the phosphor 6 that is closest to the substrate 2 is preferably at a position 100 μm (corresponding to $h_3$ in FIG. 3) lower than an upper edge of the circular tube-shaped member 4 or at a position higher than the position. Through the configuration described above, the amount of the phosphor in proximity to the solid-state light-emitting element 3 can be reduced and deterioration of light-emission characteristics over time due to degradation of the phosphor can be sufficiently inhibited.

Herein, it is required that the phosphor 6 is excited by light of a light-emission wavelength of the solid-state light-emitting element 3. The phosphor 6 can be selected as appropriate depending on the type of solid-state light-emitting element that is used and so forth without any specific limitations and can for example be a phosphor that is excited by blue light and emits yellow fluorescent light (yellow phosphor), a phosphor that is excited by blue light and emits green fluorescent light (green phosphor), or a phosphor that is excited by blue light and emits red fluorescent light (red phosphor). Any one of such phosphors may be used individually or any two or more of such phosphors may be used in combination. Among such phosphors, a yellow phosphor is preferable from a viewpoint of artificially obtaining white light through combination with light emission by a blue light-emitting diode. Examples of yellow phosphors that can be used include YAG (yttrium aluminum garnet) phosphors, silicate phosphors such as $M_2SiO_4$ (M is a group 2 element such as Sr, Ca, or Ba), and nitride phosphors such as α-SiAlON.

(Light-Emitting Device Production Method)

The following describes, for each of three embodiments, a light-emitting device production method according to one embodiment of the present disclosure that enables production of the presently disclosed light-emitting device described above. Note that specific configurations of elements in the light-emitting device production method according to one embodiment of the present disclosure are the same as previously described for the presently disclosed light-emitting device.

First Embodiment

A light-emitting device production method according to a first embodiment of the present disclosure (hereinafter, also referred to simply as "the production method according to the first embodiment") includes a circular tube-shaped member positioning step, a potting step, and a curing step, and may further include a resin composition preparation step as required.

<<Circular Tube-Shaped Member Positioning Step>>

The circular tube-shaped member positioning step is a step in which a circular tube-shaped member having a water repellent inner surface is positioned on a substrate on which a solid-state light-emitting element is mounted such that the circular tube-shaped member surrounds the solid-state light-emitting element.

No specific limitations are placed on how the circular tube-shaped member is positioned on the substrate and this positioning can for example be carried out by hand. During this step, the circular tube-shaped member is preferably positioned on the substrate such that the solid-state light-emitting element is positioned at the center of a circle of the circular tube-shaped member. Furthermore, when the circular tube-shaped member is positioned on the substrate, the circular tube-shaped member may be affixed to the substrate using a freely selected adhesive.

<<Resin Composition Preparation Step>>

The resin composition preparation step is a step in which a curable transparent resin composition used in the potting step is prepared.

The curable transparent resin composition contains a phosphor that is excited by light of a light-emission wavelength of the solid-state light-emitting element mounted on the substrate. The curable transparent resin composition can be prepared by mixing at least the aforementioned phosphor and a curable transparent resin, and also various additives as required such as a plasticizer, a pigment, an antioxidant, a heat stabilizer, a light stabilizer, a light dispersing material, an anti-settling material, and a filler. The mixing method can be selected as appropriate depending on the objective without any specific limitations other than enabling homogenous mixing and can for example be mixing by vacuum stirring, propeller stirring in a vacuum desiccator, or rotation stirring using centrifugal force by rotation/revolution. Although the concentration of the phosphor in the curable transparent resin composition may be selected as appropriate depending on the objective without any specific limitations, the concentration is preferably from 0.5 mass % to 10 mass % from a viewpoint of obtaining desired light-emission characteristics.

<<Potting Step>>

The potting step is a step in which, after the circular tube-shaped member positioning step, the curable transparent resin composition containing the phosphor is potted inside the circular tube-shaped member on the substrate. Note that the phosphor contained in the curable transparent resin composition is a phosphor that is excited by light of a light-emission wavelength of the solid-state light-emitting element mounted on the substrate.

The curable transparent resin composition potted in the potting step encapsulates the solid-state light-emitting element and is in contact with the inner surface of the circular tube-shaped member. Herein, the curable transparent resin composition can be potted in excess of the capacity of an inner space of the circular tube-shaped member because the inner surface of the circular tube-shaped member is water repellent. Furthermore, curable transparent resin composition that becomes positioned higher than an upper edge of the circular tube-shaped member naturally forms a dome shape and, as a result, a transparent resin portion (uncured) including a cylindrical section and a dome-shaped section is formed. The reason that a dome-shaped section such as described above is obtained is thought to be due to the characteristic surface tension at the water repellent inner surface of the circular tube-shaped member.

Potting of the curable transparent resin composition in the potting step is preferably carried out while monitoring the amount of the curable transparent resin composition that is potted using an electronic balance or the like. Furthermore, the curable transparent resin composition that is potted in the potting step is preferably potted to at least the capacity of the inner space of the circular tube-shaped member. The radius of curvature (degree of curving) of the dome-shaped section can be adjusted by adjusting the amount of the curable transparent resin composition that is potted in the potting step. However, it is necessary to be aware that the curable transparent resin composition may overflow from the circular tube-shaped member if an excessive amount of the curable transparent resin composition is potted inside the circular tube-shaped member.

<<Curing Step>>

The curing step is a step in which the uncured transparent resin portion formed in the potting step is cured.

The method of curing can be selected as appropriate depending on the type of resin that is used without any specific limitations other than being a method that enables curing of the curable transparent resin composition. In a situation in which the curable transparent resin composition contains a thermosetting transparent resin, a heating temperature of from 120° C. to 160° C. is preferable from a viewpoint of achieving sufficient curing and a heating time of from 1 hour to 6 hours is preferable from a viewpoint of achieving sufficient curing.

A light-emitting device can be easily obtained upon completion of the curing step. Through the production method according to the first embodiment, which is based on the above description, it is possible to produce, without any specific limitations, a light-emitting device such as illustrated in FIG. 1 that includes a cylindrical section and a dome-shaped section, and that contains a phosphor in both of these sections. An advantage of the production method according to the first embodiment is that a light-emitting device can be more easily obtained through a single potting step and a single curing step.

Second Embodiment

A light-emitting device production method according to a second embodiment of the present disclosure (hereinafter, also referred to simply as "the production method according to the second embodiment") includes a circular tube-shaped member positioning step, a first potting step, a first curing step, a second potting step, and a second curing step, and may further include a resin composition preparation step as required.

<<Circular Tube-Shaped Member Positioning Step>>

The circular tube-shaped member positioning step is a step in which a circular tube-shaped member having a water repellent inner surface is positioned on a substrate on which a solid-state light-emitting element is mounted such that the circular tube-shaped member surrounds the solid-state light-emitting element. The specific procedure in the circular tube-shaped member positioning step is the same as the circular tube-shaped member positioning step in the production method according to the first embodiment.

<<Resin Composition Preparation Step>>

The resin composition preparation step is a step in which a first curable transparent resin composition used in the first potting step and/or a second curable transparent resin composition used in the second potting step are prepared.

The first curable transparent resin composition can be prepared by mixing at least a curable transparent resin with various additives as required such as a phosphor, a plasticizer, a pigment, an antioxidant, a heat stabilizer, a light stabilizer, a light dispersing material, an anti-settling material, and a filler. However, from a viewpoint of obtaining a light-emitting device that more effectively inhibits deterioration of light-emission characteristics over time, the first curable transparent resin composition preferably does not contain a phosphor. Furthermore, the first curable transparent resin composition may be composed solely of the curable transparent resin.

The second curable transparent resin composition is the same as the curable transparent resin composition in the production method according to the first embodiment.

<<First Potting Step>>

The first potting step is a step in which, after the circular tube-shaped member positioning step, the first curable transparent resin composition is potted inside the circular tube-shaped member on the substrate.

The first curable transparent resin composition potted in the first potting step encapsulates the solid-state light-emitting element and forms a first transparent resin portion (uncured) that has a cylindrical shape. Potting of the first curable transparent resin composition in the first potting step is preferably carried out such that the first curable transparent resin composition does not reach a position 100 μm lower than an upper edge of the circular tube-shaped member. The first potting step is carried out in this manner in order that a good dome-shaped section can be obtained in the second potting step described further below.

The amount of the first curable transparent resin composition that is potted in the first potting step is preferably monitored using an electronic balance or the like.

<<First Curing Step>>

The first curing step is a step in which the uncured first transparent resin portion formed in the first potting step is cured.

The method of curing can be selected as appropriate depending on the objective without any specific limitations other than enabling curing of the curable transparent resin composition. Note that it is only necessary to carry out the curing in the first curing step such as to reduce the fluidity of the first transparent resin portion to a certain extent. In a situation in which the first curable transparent resin composition contains a thermosetting transparent resin, a heating temperature of from 80° C. to 150° C. is preferable from a viewpoint of sufficiently reducing fluidity and a heating time of from 0.25 hours to 1 hour is preferable from a viewpoint of sufficiently reducing fluidity in a short period of time.

<<Second Potting Step>>

The second potting step is a step in which the second curable transparent resin composition is potted above the first transparent resin portion cured in the first curing step. The second curable transparent resin composition contains a phosphor that is excited by light of a light-emission wavelength of the solid-state light-emitting element mounted on the substrate.

The second curable transparent resin composition potted in the second potting step is in contact with the inner surface of the circular tube-shaped member. Herein, the second curable transparent resin composition can be potted in excess of the capacity of an inner space of the circular tube-shaped member because the inner surface of the circular tube-shaped member is water repellent. In the same way as in the first embodiment, second curable transparent resin composition that becomes positioned higher than the upper edge of the circular tube-shaped member naturally forms a dome shape. As a result, a second transparent resin portion (uncured) including a dome-shaped section is formed.

Potting of the second curable transparent resin composition in the second potting step is preferably carried out while monitoring the amount of the second curable transparent resin composition that is potted using an electronic balance or the like. Furthermore, the second curable transparent resin composition is preferably potted to at least the capacity of the inner space of the circular tube-shaped member in the second potting step. The radius of curvature (degree of curving) of the dome-shaped section can be adjusted by adjusting the amount of the second curable transparent resin composition that is potted in the second potting step. However, it is necessary to be aware that the second curable transparent resin composition may overflow from the circular tube-shaped member if an excessive amount of the second curable transparent resin composition is potted inside the circular tube-shaped member.

<<Second Curing Step>>

The second curing step is a step in which the uncured second transparent resin portion formed in the second potting step is cured. The specific procedure in the second curing step is the same as the curing step in the production method according to the first embodiment.

A light-emitting device can be easily obtained upon completion of the second curing step. Through the production method according to the second embodiment, which is based on the above description, it is possible to produce, without any specific limitations, a light-emitting device such as illustrated in FIG. 2 that includes a cylindrical section and a dome-shaped section and in which a phosphor is, to at least a certain extent, separated from a solid-state light-emitting element. An advantage of the production method according to the second embodiment is that the phosphor contained in a transparent resin portion of the light-emitting device can be separated from the solid-state light-emitting element as desired.

Third Embodiment

A light-emitting device production method according to a third embodiment of the present disclosure (hereinafter, also referred to simply as "the production method according to the third embodiment") includes a circular tube-shaped member positioning step, a first potting step, a second potting step, and a curing step, and may further include a resin composition preparation step as required.

<<Circular Tube-Shaped Member Positioning Step>>

The circular tube-shaped member positioning step is a step in which a circular tube-shaped member having a water repellent inner surface is positioned on a substrate on which a solid-state light-emitting element is mounted such that the circular tube-shaped member surrounds the solid-state light-emitting element. The specific procedure in the circular tube-shaped member positioning step is the same as the circular tube-shaped member positioning step in the production method according to the second embodiment.

<<Resin Composition Preparation Step>>

The resin composition preparation step is a step in which a first curable transparent resin composition used in the first potting step and/or a second curable transparent resin composition used in the second potting step are prepared. The specific procedure in the resin composition preparation step is the same as the resin composition preparation step in the production method according to the second embodiment.

<<First Potting Step>>

The first potting step is a step in which the first curable transparent resin composition is potted inside the circular tube-shaped member on the substrate. The specific procedure in the first potting step is the same as the first potting step in the production method according to the second embodiment.

<<Second Potting Step>>

The second potting step is a step in which the second curable transparent resin composition is further potted above the potted first transparent resin composition. The second curable transparent resin composition contains a phosphor that is excited by light of a light-emission wavelength of the solid-state light-emitting element mounted on the substrate.

The specific procedure in the second potting step is the same as the second potting step in the production method according to the second embodiment. An uncured transparent resin portion including a cylindrical section and a dome-shaped section is formed through the first potting step and the second potting step.

The second potting step in the production method according to the third embodiment differs from the second potting step in the production method according to the second embodiment in terms that the second potting step in the production method according to the third embodiment is carried out after the first potting step without carrying out a first curing step.

<<Curing Step>>

The curing step is a step in which the uncured transparent resin portion formed through the first potting step and the second potting step is cured. The specific procedure in the curing step is the same as the curing step in the production method according to the first embodiment.

A light-emitting device can be easily obtained upon completion of the curing step. Through the production method according to the third embodiment, which is based on the above description, it is possible to produce, without any specific limitations, a light-emitting device such as illustrated in FIG. 2 that includes a cylindrical section and a dome-shaped section, and in which a phosphor is, to at least a certain extent, separated from a solid-state light-emitting element. An advantage of the production method according to the third embodiment is that a light-emitting device can be more easily obtained through a single curing step.

EXAMPLES

The following provides a more specific explanation of the present disclosure through examples, a comparative example, and reference examples. However, the present disclosure is not limited to the following examples.

It should be noted that the reference examples described further below are examples in which light-emitting devices were produced in which a phosphor was intentionally omitted in order to clearly compare light extraction efficiency of light-emitting devices in accordance with the present disclosure with light extraction efficiency of light-emitting devices that are not in accordance with the present disclosure.

Example 1

Positioning of Circular Tube-Shaped Member on Substrate

First, a substrate was prepared on which a blue light-emitting diode was directly mounted in chip-on-board (COB) format and that was electrically connected to the blue light-emitting diode by a wire bonding method. Next, a fluorine-containing resin (PTFE produced by Yodogawa Hu-Tech Co., Ltd.) was prepared and was processed into a ring shape having an internal diameter of 3 mm, an external diameter of 3.6 mm, and a tube length of 1.5 mm to produce a circular tube-shaped member. The circular tube-shaped member was affixed onto the substrate using a silicone-based adhesive (SWR-SA-901 produced by Asahi Rubber Inc.) such as to surround the blue light-emitting diode with the blue light-emitting diode at the center of the circular tube-shaped member. As a result, a blue light-emitting diode-bearing substrate equipped with the circular tube-shaped member was obtained.

<Preparation of Curable Transparent Resin Composition>

A transparent phenyl silicone resin (OE-6550A/B produced by Dow Corning Toray Co., Ltd.) was weighed out in an amount of 9.95 g and was added into an ointment container (UG-3-52 produced by Umano Kagaku Youki Kabushiki Gaisha) having a capacity of 12 mL. In addition, a sulfide phosphor ($SrGa_2S_4$) having a property of excitation by light of a light-emission wavelength of the blue light-emitting diode described above was weighed out in an amount of 0.05 g and was added into the ointment container. A vacuum stirring mixer (ARV-250LED produced by Thinky Corporation) was used to perform vacuum stirring of the container for 3 minutes at 1,500 rpm. As a result, 10 g of a curable transparent resin composition having a phosphor concentration of 0.5 mass % was prepared.

<Potting of Curable Transparent Resin Composition>

The blue light-emitting diode-bearing substrate equipped with the circular tube-shaped member was set on a precision electronic balance (GR-202 produced by A&D Company, Limited). The curable transparent resin composition described above was transferred using a spatula and 16 mg of the curable transparent resin composition was loaded (potted) inside the circular tube-shaped member such as to encapsulate the blue light-emitting diode. During the above, a dome-shaped section was naturally obtained due to surface tension at the water repellent inner surface of the circular tube-shaped member, and an uncured transparent resin portion that included a cylindrical section and the dome-shaped section was formed on the substrate.

<Curing of Transparent Resin Portion>

The substrate on which the uncured transparent resin portion was formed as described above was held in a 150° C. air oven for 1 hour in order to cure the uncured transparent resin portion. As a result, a light-emitting device A was produced that included a cylindrical section and a dome-shaped section, and in which a phosphor was dispersed in both of these sections as illustrated in FIG. 1.

Example 2

Positioning of Circular Tube-Shaped Member on Substrate

A blue light-emitting diode-bearing substrate equipped with a circular tube-shaped member was obtained in the same way as in Example 1.

<Preparation of First and Second Curable Transparent Resin Compositions>

A transparent phenyl silicone resin (OE-6550A/B produced by Dow Corning Toray Co., Ltd.) weighed out in an amount of 3 g was used as a first curable transparent resin composition.

Next, a transparent phenyl silicone resin (OE-6550A/B produced by Dow Corning Toray Co., Ltd.) was weighed out in an amount of 9.85 g and was added into an ointment container (UG-3-52 produced by Umano Kagaku Youki Kabushiki Gaisha) having a capacity of 12 mL. In addition, a sulfide phosphor ($SrGa_2S_4$) having a property of excitation by light of a light-emission wavelength of the blue light-emitting diode described above was weighed out in an amount of 0.15 g and was added into the ointment container. A vacuum stirring mixer (ARV-250LED produced by Thinky Corporation) was used to vacuum stir the container for 3 minutes at 1,500 rpm. As a result, 10 g of a second curable transparent resin composition having a phosphor concentration of 1.5 mass % was prepared.

<Potting of First Curable Transparent Resin Composition>

The blue light-emitting diode-bearing substrate equipped with the circular tube-shaped member was set on a precision electronic balance (GR-202 produced by A&D Company, Limited). The first curable transparent resin composition described above was transferred using a spatula and 9 mg of the first curable transparent resin composition was loaded (potted) inside the circular tube-shaped member such as to encapsulate the blue light-emitting diode. The amount of the first curable transparent resin composition that was loaded was set such that the height of the first curable transparent resin composition after loading did not reach an upper edge of the circular tube-shaped member. As a result, an uncured first transparent resin portion having a cylindrical shape was formed.

<Curing of First Transparent Resin Portion>

The substrate on which the uncured first transparent resin portion was formed as described above was held in a 150° C. air oven for 30 minutes in order to semi-cure the uncured first transparent resin portion (in other words, cure the first transparent resin portion to the extent that fluidity of the first transparent resin portion was reduced by a certain amount).

<Potting of Second Curable Transparent Resin Composition>

Next, the substrate having the semi-cured first transparent resin portion thereon was again set on the precision electronic balance. The second curable transparent resin composition described above was transferred using a spatula and 7 mg of the second curable transparent resin composition was loaded (potted) above the semi-cured first transparent resin portion inside the circular tube-shaped member. During the above, a dome-shaped section was naturally formed due to surface tension at the water repellent inner surface of the circular tube-shaped member, and an uncured second transparent resin portion that included the dome-shaped section was formed.

<Curing of Second Transparent Resin Portion>

The substrate on which the uncured second transparent resin portion was formed as described above was held in a 150° C. air oven for 1 hour in order to cure the uncured second transparent resin portion. As a result, a light-emitting device B was produced that included a cylindrical section and a dome-shaped section, and in which a phosphor was separated to a certain extent from a blue light-emitting diode as illustrated in FIG. 2.

Comparative Example 1

A light-emitting device C was produced by preparing a substrate on which a blue light-emitting diode was directly mounted in the same way as in Example 1, preparing a curable transparent resin composition in the same way as in Example 1, and directly forming a dome-shaped section on the substrate by a known method.

(Evaluation of Light-Emitting Device Light-Emission Characteristics)

A light measurement device (produced by Labsphere Inc., system model name: CSLMS-LED-1061, model: 10-inch (Φ25)/LMS-100) was used to obtain a chromaticity point in a u'v' chromaticity diagram for a light-emission color of the light-emitting device in each of Examples 1 and 2 and Comparative Example 1. Next, each of the light-emitting devices was subjected to an environmental test in which the light-emitting device was placed in a high-temperature and high-humidity environment (temperature 70° C., relative humidity 85%), and was turned on continuously for 168 hours at 140 mA. Next, a chromaticity point in u'v' chromaticity coordinates was obtained in the same way as described above for the light-emission color of each of the light-emitting devices after the environmental test. The degree of change (Δv') in the v' axis value before and after the environmental test was evaluated. The results are shown in Table 1 and FIG. 4. When the value described above is small for a light-emitting device, this indicates that degradation is unlikely to occur even in a harsh environment and that deterioration of light-emission characteristics over time is inhibited.

TABLE 1

| | Example 1 | Example 2 | Comparative Example 1 |
|---|---|---|---|
| Light-emitting device | A | B | C |
| Inclusion of cylindrical section | Yes | Yes | No |
| Inclusion of dome-shaped section | Yes | Yes | Yes |
| Phosphor distribution in transparent resin portion | Uniform distribution | Not present in proximity to blue light-emitting diode | Uniform distribution |
| Chromaticity (u') before environmental test | 0.1469 | 0.1480 | 0.1476 |
| Chromaticity (v') before environmental test | 0.3737 | 0.3689 | 0.3699 |
| Chromaticity (v') after environmental test | 0.3504 | 0.3628 | 0.3418 |
| Difference (Δv') in chromaticity (v') before and after environmental test | $-2.33 \times 10^{-2}$ | $-6.13 \times 10^{-3}$ | $-2.81 \times 10^{-2}$ |

Reference Example 1

A light-emitting device D including a dome-shaped section formed directly on a substrate was produced in the same way as in Comparative Example 1 with the exception that the sulfide phosphor ($SrGa_2S_4$) used in preparation of the curable transparent resin composition in Comparative Example 1 was omitted.

Reference Example 2

A light-emitting device E including a cylindrical section and a dome-shaped section was produced in the same way as in Example 1 with the exception that the sulfide phosphor ($SrGa_2S_4$) used in preparation of the curable transparent resin composition in Example 1 was omitted.

Reference Example 3

A light-emitting device F including a dome-shaped section having a smaller radius of curvature than in Reference Example 2 (i.e., having a greater degree of curving than in Reference Example 2) was produced in the same way as in Reference Example 2 with the exception that the amount of the curable transparent resin composition potted inside the circular tube-shaped member in Reference Example 2 was increased.

Reference Example 4

A light-emitting device G including a cylindrical section but not a dome-shaped section was produced in the same way as in Reference Example 2 with the exception that the amount of the curable transparent resin composition potted inside the circular tube-shaped member in Reference Example 2 was reduced.

Reference Example 5

A light-emitting device H was produced in the same way as in Reference Example 2 with the exception that the circular tube-shaped member prepared using the fluorine-containing resin in Reference Example 2 was replaced with a circular tube-shaped member of the same shape prepared using stainless steel. In Reference Example 5, an inner surface of the circular tube-shaped member was wetted by the potted curable transparent resin composition and did not repel the curable transparent resin composition. Consequently, a central section of the transparent resin portion in the obtained light-emitting device H had a depressed (concave) shape.

Note that in the example described above, it was discovered that when further potting of the curable transparent resin composition was carried out, the curable transparent resin composition overflowed from the circular tube-shaped member without forming a dome shape.

Reference Examples 6-9

Light-emitting devices I, J, K, and L having the same configurations as the light-emitting devices in Reference Examples 1-4, respectively, were produced in the same way as in Reference Examples 1-4 with the exception that the phenyl silicone resin used in preparation of the curable transparent resin compositions in Reference Examples 1-4 was replaced with a methyl silicone resin (KER-2500 produced by Shin-Etsu Chemical Co., Ltd.).

Reference Example 10

A light-emitting device M was produced in the same way as in Reference Example 7 with the exception that the circular tube-shaped member prepared using the fluorine-containing resin in Reference Example 7 was replaced with a circular tube-shaped member of the same shape prepared using stainless steel. In Reference Example 10, an inner surface of the circular tube-shaped member was wetted by the potted curable transparent resin composition and did not repel the curable transparent resin composition. Consequently, a central section of the transparent resin portion in the obtained light-emitting device M had a depressed (concave) shape.

Note that in the example described above, it was discovered that when further potting of the curable transparent resin composition was carried out, the curable transparent resin composition overflowed from the circular tube-shaped member without forming a dome shape.

(Evaluation of Light-Emitting Device Light Extraction Efficiency)

A light measurement device (produced by Labsphere Inc., system model name: CSLMS-LED-1061, model: 10-inch (Φ25)/LMS-100) was used to measure a spectral radiant flux (intensity: W/nm) spectrum for the light-emitting device in each of Reference Examples 1-10 through an integrating sphere and calculate the total radiant flux (units: W) as an integrated value of intensities at all wavelengths. The total radiant flux in each of Reference Examples 2-5 is shown as an index in which the total radiant flux in Reference Example 1 has a value of 100 and the total radiant flux in each of Reference Examples 7-10 is shown as an index in which the total radiant flux in Reference Example 6 has a value of 100. The results are shown in Tables 2 and 3. When a light-emitting device has a high index value, this indicates that the light-emitting device has excellent light extraction efficiency.

difference (Δv') in the chromaticity (v') before and after the environmental test was smaller for the light-emitting devices in Examples 1 and 2 than for the light-emitting device in Comparative Example 1. These results demonstrate that as a result of the presently disclosed light-emitting device including at least the prescribed cylindrical section, deterioration of light-emission characteristics over time is favorably inhibited.

Furthermore, it was confirmed from the results in Tables 2 and 3 that light extraction efficiency of a light-emitting device is increased through inclusion of the prescribed dome-shaped section. These results demonstrate that the presently disclosed light-emitting device including at least the prescribed dome-shaped section has excellent light extraction efficiency.

The examples, the comparative example, and the reference examples described above demonstrate that a light-emitting device including the prescribed cylindrical section and dome-shaped section can be easily produced through use of at least a circular tube-shaped member having a water repellent inner surface.

INDUSTRIAL APPLICABILITY

According to the present disclosure, it is possible to provide a light-emitting device that has excellent light

TABLE 2

|  | Reference Example 1 | Reference Example 2 | Reference Example 3 | Reference Example 4 | Reference Example 5 |
|---|---|---|---|---|---|
| Light-emitting device | D | E | F | G | H |
| Inclusion of cylindrical section | No | Yes | Yes | Yes | Yes |
| Inclusion of dome-shaped section | Yes | Yes | Yes | No | No (depression present) |
| Material of circular tube-shaped member | Not used | PTFE | PTFE | PTFE | Stainless steel |
| Type of transparent resin | Phenyl silicone | Phenyl silicone | Phenyl silicone | Phenyl silicone | Phenyl silicone |
| Total radiant flux (index value) | 100 | 99.8 | 101.4 | 89.9 | 49.4 |

TABLE 3

|  | Reference Example 6 | Reference Example 7 | Reference Example 8 | Reference Example 9 | Reference Example 10 |
|---|---|---|---|---|---|
| Light-emitting device | I | J | K | L | M |
| Inclusion of cylindrical section | No | Yes | Yes | Yes | Yes |
| Inclusion of dome-shaped section | Yes | Yes | Yes | No | No (depression present) |
| Material of circular tube-shaped member | Not used | PTFE | PTFE | PTFE | Stainless steel |
| Type of transparent resin | Methyl silicone | Methyl silicone | Methyl silicone | Methyl silicone | Methyl silicone |
| Total radiant flux (index value) | 100 | 101.0 | 101.2 | 98.8 | 56.1 |

Figure 4:
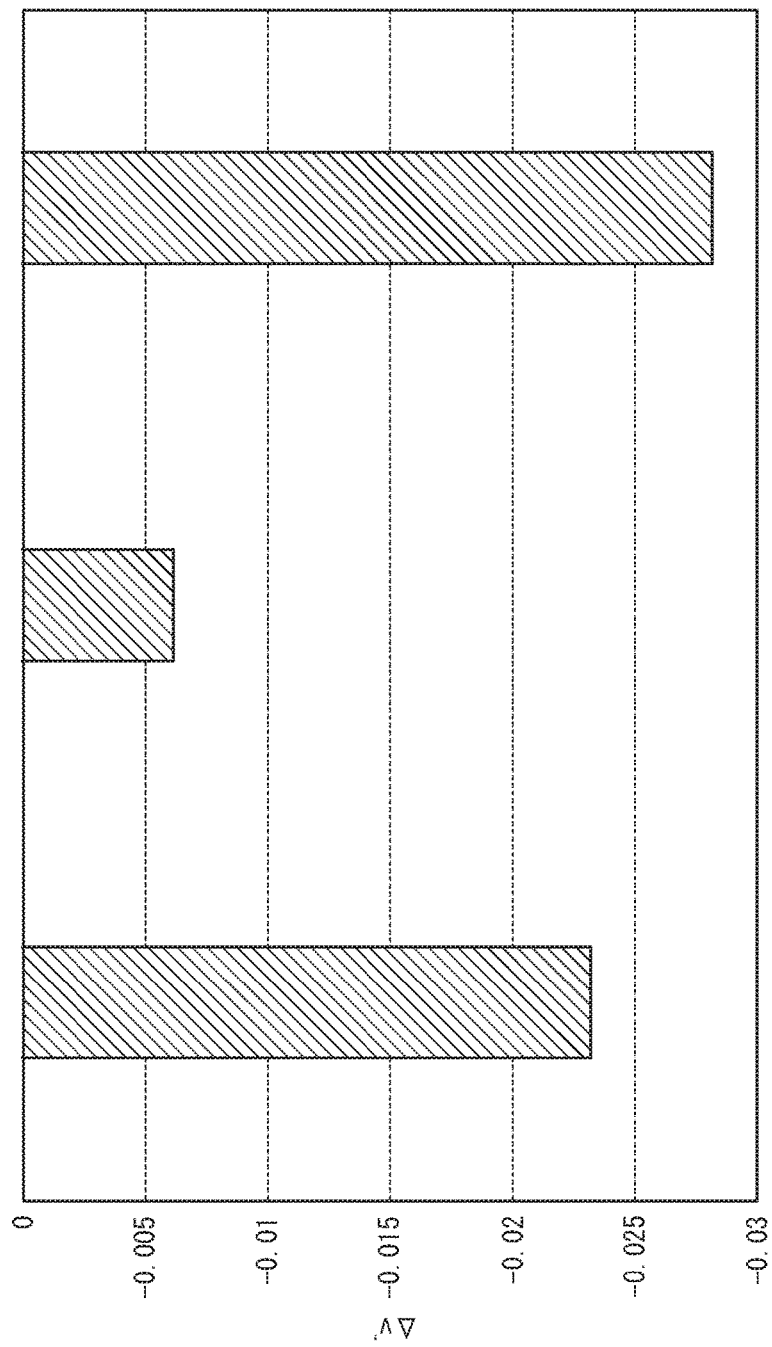
FIG. 4 illustrates the difference (Δv') between chromaticity (v') before and after an environmental test for light-emitting devices according to examples and a comparative example.
Figure 5:
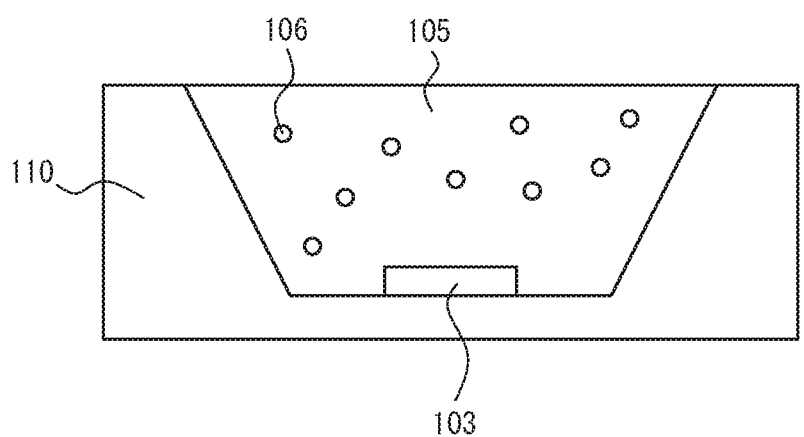
FIG. 5 is an overview of a conventional light-emitting device (first example) that uses a solid-state light-emitting element.
Figure 6:
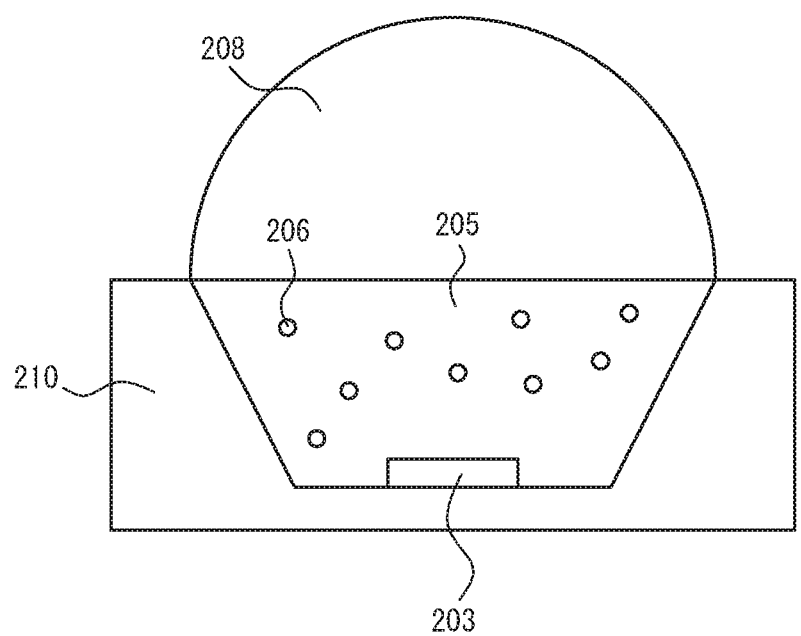
FIG. 6 is an overview of a conventional light-emitting device (second example) that uses a solid-state light-emitting element.

It was confirmed from the results in Table 1 and FIG. 4 that despite the light-emitting devices in Examples 1 and 2 and the light-emitting device in Comparative Example 1 having substantially that same value for chromaticity (v') before the environmental test, the absolute value of the extraction efficiency, inhibits deterioration of light-emission characteristics over time, and can be easily produced. Furthermore, according to the present disclosure, it is possible to provide a light-emitting device production method that enables simple production of a light-emitting device that has excellent light extraction efficiency and inhibits deterioration of light-emission characteristics over time.

The invention claimed is:

1. A light-emitting device comprising:
   a substrate;
   a solid-state light-emitting element mounted on the substrate;
   a circular tube-shaped member positioned on the substrate such as to surround the solid-state light-emitting element; and
   a transparent resin portion including a cylindrical section that encloses the solid-state light-emitting element and that is in contact with an inner surface of the circular tube-shaped member, and a dome-shaped section that is positioned above the cylindrical section, wherein
   the inner surface of the circular tube-shaped member is water repellent, and
   the cylindrical section and the dome-shaped section contain a phosphor that is excited by light of a light-emission wavelength of the solid-state light-emitting element, and
   among the phosphor contained in the transparent resin portion, a portion of the phosphor that is closest to the substrate is at a position at least 500 μm higher than an upper edge of the solid-state light-emitting element and lower than an upper edge of the circular tube-shaped member.

2. The light-emitting device of claim 1, wherein
   among the phosphor contained in the transparent resin portion, the portion of the phosphor that is closest to the substrate is at a position 100 μm lower than an upper edge of the circular tube-shaped member or at a position higher than the position.

3. The light-emitting device of claim 1, wherein
   the solid-state light-emitting element is a light-emitting diode.

4. The light-emitting device of claim 3, wherein
   the light-emitting diode is a blue light-emitting diode and white light is obtained artificially through a combination of light emission by the blue light-emitting diode and light emission by the phosphor.

* * * * *